United States Patent [19]
Masiewicz

[11] Patent Number: 5,677,639
[45] Date of Patent: Oct. 14, 1997

[54] AUTONOMOUS SELECTION OF OUTPUT BUFFER CHARACTERISTICS AS DETERMINED BY LOAD MATCHING

[75] Inventor: John Chester Masiewicz, San Jose, Calif.

[73] Assignee: Seagate Technology, Inc., Scotts Valley, Calif.

[21] Appl. No.: 352,375

[22] Filed: Dec. 8, 1994

[51] Int. Cl.⁶ .................... H03K 17/16; H03K 19/0175
[52] U.S. Cl. .................... 326/82; 326/30; 375/257
[58] Field of Search .................... 326/82, 83, 30; 375/257

[56] References Cited

U.S. PATENT DOCUMENTS

| | | | |
|---|---|---|---|
| 4,684,824 | 8/1987 | Moberg | 326/82 |
| 5,134,311 | 7/1992 | Biber et al. | 326/82 |
| 5,319,258 | 6/1994 | Ruetz | 326/82 |
| 5,568,068 | 10/1996 | Ota et al. | 326/82 |

*Primary Examiner*—Edward P. Westin
*Assistant Examiner*—Richard Roseen
*Attorney, Agent, or Firm*—Flehr Hohbach Test Albritton & Herbert LLP

[57] ABSTRACT

A mechanism determines at least an approximation of output load coupled to a programmable output buffer, and then programs the buffer to source/sink an amount of output current appropriate to the load to be driven. The mechanism includes a load recognition unit, an optional signal conditioner, and a reconfiguration logic module. In interface-governed applications, the load recognition unit senses an interface bit (AT Attachment interface), or causes the output buffer to act as a master unit that polls the interface connection to determine the number of attached loads (SCSI interface). The recognition unit then outputs a signal that may be conditioned before being input to a reconfiguration logic module that outputs appropriate control signals that program the buffer. Alternatively, the load recognition unit may measure the shunt capacitance associated with the load by using a reference current source and an analog/digital converter. The resultant voltage developed across the shunt capacitance provides a measure of the load impedance, which is used by the reconfiguration logic module to output control signals appropriately configuring the output buffer. Preferably the output buffer includes a plurality of individually-enableable unit buffers. The reconfiguration logic module can enable only such unit buffers whose current handling contributions are necessary to drive the approximated or measured load to be driven.

24 Claims, 6 Drawing Sheets

AUTONOMOUS SELECTION OF OUTPUT BUFFER CHARACTERISTICS AS DETERMINED BY LOAD MATCHING

FIELD OF THE INVENTION

This invention relates to matching drive characteristics of output buffers to a load, and more specifically to output buffers associated with hard disc drive storage units and techniques for autonomously matching output characteristics of such buffers to the load being driven.

BACKGROUND OF THE INVENTION

Output buffers are integrated circuits ("ICs") used to interface a digital input signal to a typically large capacitive and/or resistive load that is often a system buss or an interconnect cable. In many applications, the magnitude of the load capacitance/resistance to be driven by an output buffer is not known when the buffer is designed.

FIG. 1A depicts generically an enableable output buffer 2, which typically operates from an upper power supply Vdd and a lower power supply Vss that is often ground. The buffer receives DATA IN as an input and outputs a DATA OUTPUT signal, when the OUTPUT ENABLE signal is present (e.g., is a digital "1"). Depending upon the circuit design, DATA OUTPUT may replicate or be an inverted version of DATA IN, and the buffer may enable with the OUTPUT ENABLE is a digital "0". The output of buffer 2 is shown coupled to a load impedance $Z_L$ that may be represented generally by a resistance $R_L$ shunted by an effective capacitive load $C_L$. Load impedance $Z_L$ typically represents a long buss, or perhaps a signal cable of many meters lengths. In some applications, $Z_L$ may be primarily a load resistance e.g., $R_L$, or a load capacitance $C_L$, or a combination of each.

As shown in FIG. 1A, buffer 2 may be implemented with bipolar transistors, complementary metal-on-semiconductor ("CMOS") transistors, or a combination of each ("Bi-CMOS"). Buffer 2 typically will include two inverters I1 (here a NAND gate) and I2 coupled in series, or I3 (here a NOR gate) and I2 coupled in series. The output of the first inverter is presented as input to the second inverter, and the output of the second inverter is the buffer output, which has the same phase as the input to the first inverter.

In the CMOS implementation of FIG. 1A, each inverter comprises a P-type pull-up metal-on-semiconductor ("PMOS") transistor and an N-type MOS ("NMOS") transistor coupled in series between Vdd and Vss. For example, I1 may comprise a PMOS transistor P1 (not shown) and an NMOS transistor N1 (not shown), I2 comprises PMOS transistor P2 and NMOS transistor N2, and I3 comprises transistors P3, N3 (not shown). Because I2 drives load $Z_L$, output transistors P2 and N2 will generally be larger sized devices than the transistors comprising I1 or I3.

The enabling function may be implemented using the NAND gate (I1), INVERTER and NOR gate (I3) logic shown, or using other techniques well known to those skilled in the relevant art.

When DATA IN is a digital "1", within I1, P1 turns off and N1 turns on, and the first inverter output is a digital "0". Upon receipt of this "0", in the second inverter I2, P2 turns on, N2 turns off, and the DATA OUTPUT will be a digital "1", and buffer 2 sources current into $Z_L$. When DATA IN is a digital "0", P1 turns on, N1 turns off, and the output from the first inverter is a "1". Upon receipt of this "1", P2 in the second inverter turns off, N2 turns on, DATA OUTPUT is a "0", and buffer 2 sinks current from $Z_L$.

FIG. 1B depicts voltage and current waveforms associated with output buffer 2. For example, although DATA IN is "1" before time $t_0$, it is only after the OUTPUT ENABLE signal goes high that buffer 2 is enabled to provide the DATA OUTPUT signal. At time $t_1$, DATA IN goes low and, since OUTPUT ENABLE is still enabling buffer 2, the DATA OUTPUT signal also goes low. In the DATA OUT waveform, the voltage waveform drawn in phantom represents the case of a relatively large load capacitance $C_L$. When $C_L$ is not especially large, the output voltage waveform slews more rapidly, but can overshoot and undershoot as shown.

It is thus appreciated from the DATA OUT waveform that as $C_L$ increases, the output voltage slew rate (dV/dt) decreases. To compensate for this, it is necessary to implement buffer 2 with larger output inverter transistors, e.g., transistors that can source or sink more current (i). (Of course, this assumes that the IC containing buffer 2 has sufficient area whereon to fabricate larger transistors.) The ability to compensate for a large $C_L$ by increasing output buffer current follows from the equation:

$$i = C_L \, dV/dt$$

Although large current handling transistors can improve output voltage slewrate, a large current capability can be detrimental. In practice, buffer 2 will not function perfectly because the various pull-up and pull-down transistors do not change states in perfect synchronism. The output buffer current waveform depicts the total current $i_o$ flowing through buffer 2. The $i_o$ current wave form drawn in phantom represents total current drawn by the buffer when the various buffer transistors are themselves large devices, e.g., devices with a relatively large drain current.

Note from this waveform that current spikes occur when the buffer transistors change states, for example at times $t_0$ and $t_1$. These spikes are created because for a brief moment, the PMOS and NMOS transistors in each inverter are simultaneously on, thus presenting a low impedance current path between the Vdd and Vss power supplies. In addition, current spiking occurs because the load capacitance $C_L$ component of $Z_L$ is being charged toward Vdd or discharged toward Vss (depending upon the direction of the output state change).

Thus, the $i_o$ waveform in FIG. 1B suggests that compensating for a large load capacitance $C_L$ by implementing buffer 2 with large current transistors will aggravate current spiking. Those skilled in the art will appreciate that the current spiking waveforms can contain many high frequency components that represent electromagnetic ("EM") and radio frequency ("RF") noise that can interfere with other signals implemented on the IC containing buffer 2, and with signals elsewhere in a system containing this IC.

The current spiking can also contribute to crosstalk between various signal lines on a system including the output buffer, and can also contribute to unwanted transmission line reflections. Further, current spiking represents transient bursts of heat that must be safely dissipated by the transistors within buffer 2.

If $C_L$ were reliably known, an output buffer comprising suitably sized transistors might be readily designed and implemented. However, in so doing, existing standard buffer circuit fabrication may have to be substantially revised, especially where significantly greater output current must now be sourced/sinked. Similarly, in some applications if the magnitude of $R_L$ were known, the output buffer could be suitable designed. For example, in an application wherein DC current flow occurs, knowledge of the magnitude of $R_L$ would permit sizing the output transistors within the buffer.

In some system applications, the magnitude of $C_L$ and/or $R_L$ may not be known a priori. For example, in FIG. 2A, the host computer 4 in a computer system may be coupled to one, two or N peripherals such as hard disc drive units 6, wherein the host computer-disc drive interface includes an output buffer 2, such as depicted in FIG. 1A.

In FIG. 2A, if the output buffer were designed to source/sink current representing N hard disc drive loads, the output buffer will source/sink excessive current when fewer than N loads are coupled to the host computer. When driving less than N loads, the excessive current would improve the output voltage slew rate, but would also increase the magnitude of the current spikes during transition, as well as the transient heat required to be dissipated by the buffer transistors. On the other hand, if the output buffer were designed to source/sink current representing four loads, then the buffer voltage slewrate would be impermissibly slow if more than four loads were to be driven. See, for example, the DATA OUT phantom waveform shown in FIG. 1B depicting a slow voltage slewrate.

FIG. 2B depicts another system application wherein a hard disc drive unit 6 may be required to provide data to one or more host computers 4 that are coupled to the disc drive output buffer 2 through different lengths of cable. The result is that the output buffer 2 may be coupled to a nominal effective load capacitance $C_L$, or to a substantially different magnitude load capacitance, depending perhaps on the length of cable separating the host from the buffer. Optimizing the output buffer to drive a nominal value $C_L$ may represent a poor design choice when driving a substantially different capacitive load.

While FIGS. 2A and 2B demonstrate the problem of providing a suitably configured output buffer between one or more host computers and one or more hard disc drive units, the problem can exist in other environments as well.

Thus, there is a need for a mechanism by which an approximation may be made as to the effective load $Z_L$ to be driven by an output buffer. Using such $Z_L$ approximation, the mechanism could then autonomously program or otherwise reconfigure the output buffer source/sink current characteristics to better accommodate $Z_L$.

The present invention discloses such a mechanism for use with an output buffer. Such a mechanism would permit the output buffer to operate at reduced power dissipation, with reduction of current spiking and noise generation.

SUMMARY OF THE PRESENT INVENTION

A load sense mechanism senses the magnitude of the load to be driven by a programmable buffer, and generates control signals that program the buffer to adopt output source/sink characteristics appropriate for the load to be driven.

The load sense mechanism includes a load recognition unit, an optional signal conditioner, and a reconfiguration logic module. The load recognition unit is coupled to the sense port of the mechanism, which port is coupled to the load to be driven by the buffer. The reconfiguration logic module is coupled to the control signal output port of the mechanism, which port is coupled to the control input port of the programmable buffer. The programmable buffer has an input port coupled to receive input data, and has an output port coupled to the load to be driven.

The programmable buffer sources/sinks a magnitude of output current that may be varied in response to one or more control signals coupled to the buffer's control input port. The present invention senses the load to be driven by the output buffer, and autonomously generates such control signals for the buffer. These control signals program the buffer, causing its output current characteristics to be appropriate for the load being driven.

The recognition module senses the shunt capacitance component $C_L$ of the impedance $Z_L$ of the load to be driven. In some applications the recognition module senses the approximate load using information present in an interface between the buffer output and the load. Where an AT Attachment interface is present, the recognition module determines the number of loads to be driven from the interface bit. Where a small computer system interface ("SCSI") is present, the present invention causes the output buffer to temporarily act as a master unit that polls the interface connection to determine the number of attached SCSI-compatible hard disc drive units. Thus, where an interface governs connections to the driven load, the recognition unit can determine which of a quantized set of values best approximates the load to be driven by the output buffer.

In applications where the load may not be known within a quantized number of magnitudes, the present invention dynamically approximates $Z_L$ by its capacitive load component $C_L$. In such embodiments, the recognition module is replaced by a capacitance measuring module that measures $C_L$. This module includes a reference current generator whose current is integrated across $C_L$ for a given time interval to provide a measurable voltage that is proportional to the load to be driven. An analog/digital converter within the recognition module digitizes the voltage, which is coupled to the reconfiguration logic module. Timing logic and associated multiplexer gates within the recognition unit permit load approximation during power-up and/or during intervals between data transfer from the buffer to the load.

In the various embodiments, the output from the recognition unit or the capacitance measuring unit is coupled to an optional signal conditioner and thence to a reconfiguration logic module. The reconfiguration logic module outputs a digitized set of control signals that are coupled to the control port of the programmable output buffer unit. In response to these control signals, the output buffer unit is caused to source or sink a magnitude of current appropriate to $Z_L$.

In this fashion, the present invention causes the output buffer characteristics to be autonomously matched to the approximate load being driven. As a result, power dissipation, current spiking, and noise generation may be minimized by programming the output buffer to source/sink current that is not excessive for the load being driven.

Other features and advantages of the invention will appear from the following description in which the preferred embodiments have been set forth in detail, in conjunction with the accompanying drawings.

DETAILED DESCRIPTION OF THE PREFERRED EMBODIMENT

Figure 3A:
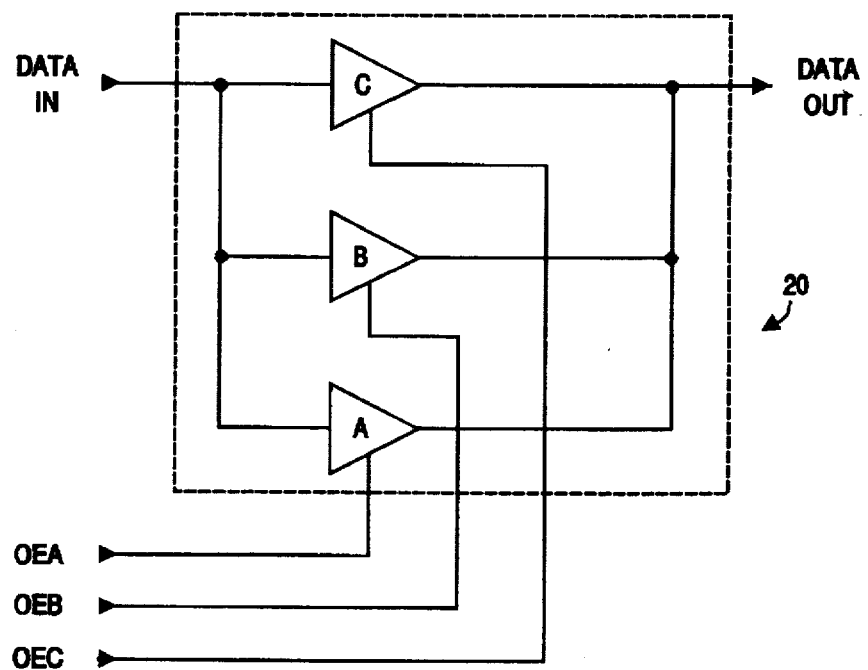
FIG. 3A is a block diagram of an output buffer with programmable drive current, with which the present invention maybe practiced.

The present invention may be used to control a variety of programmable output buffers including a generic output buffer 20 such as depicted in FIG. 3A. In FIG. 3, buffer 20 comprises a plurality of preferably conventionally designed and fabricated unit buffers A, B, and C, although more or fewer than three individual buffers depicted may be used. Any or all of the unit buffers may be similar to what has been described with respect to FIG. 1A.

In a preferred embodiment, buffer A has output transistors that can source/sink $i_A$=X mA of current, whereas buffer B has output transistors that can source/sink $i_B$=2X mA of current, and buffer C has output transistors that can source/sink $i_C$=3X mA of current. In a typical application, X may be 4, such that unit buffers A, B, C respectively can source/sink 4 mA, 8 mA, 12 mA of current. The source/sink capability $i_o$ of the output buffer 20 at a given time will be the current sum of whichever of unit buffers A, B and C are activated at that time.

These respective current handling capabilities may be implemented by providing buffer B with output transistors whose gate width by length ratio ("WxL") for CMOS implementation is twice that of the transistors in buffer A, whereas buffer C can have transistors with three times the WxL ratio of the transistors in buffer A.

Figure 3B:
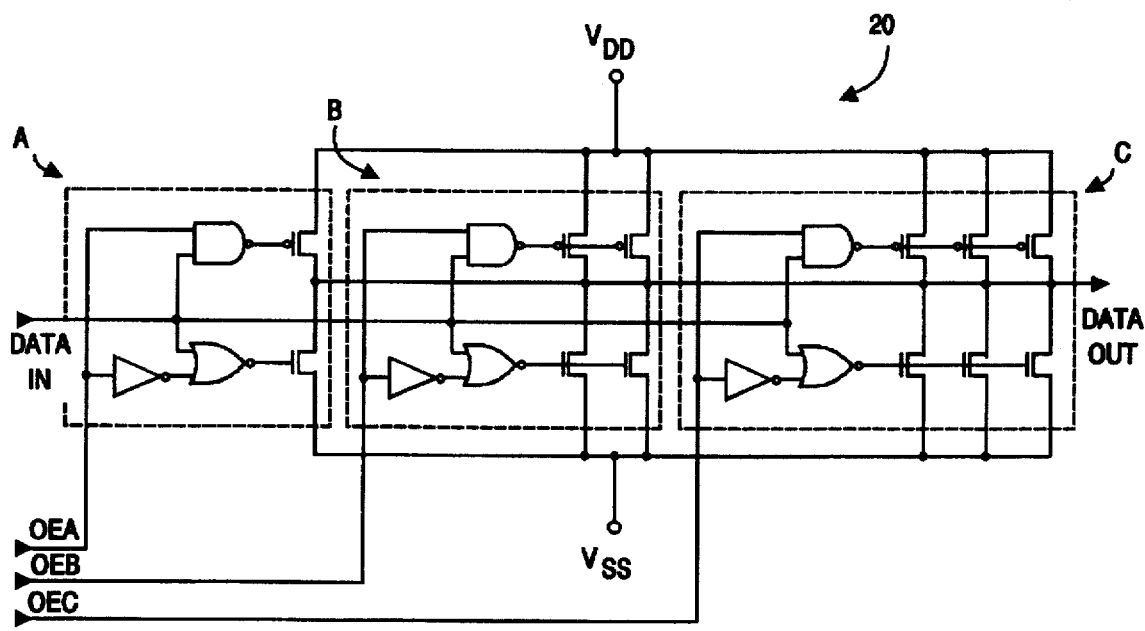
FIG. 3B is a schematic of an output buffer with programmable drive current obtaining by enabling parallel-coupled output transistors, with which the present invention may be practiced.

FIG. 3B shows an alternate embodiment of a buffer 20, wherein unit buffer B comprises two parallel-coupled pairs of output transistors, and wherein unit buffer C comprises three parallel-coupled pairs of output transistors. Each of the output transistors may be substantially identical in size, although they need not be, and different numbers of transistor pairs may be parallel-coupled in the unit buffers. The output characteristics of buffer 20 are determined by the enabling signals OEA, OEB, OEC. In this embodiment, the parallel-coupled transistors "sum" to the desired source/sink capability for buffer 20.

In FIGS. 3A and 3B, unit buffers A, B, and C respectively are enabled by OUTPUT ENABLE control signals OEA, OEB and OEC, received from the control signal output port of the present invention. TABLE 1, below, shows that programmable sink/source current $i_o$ may be dynamically reconfigured to be 1X, 2X, 3X, 4X, 5X or 6X mA. When programmable buffer 20 is used in an interface between host computers and hard disc drive units, X preferably will be in the approximately 4 mA range. Thus, as shown by TABLE 1, programmable buffer 20 can be made to source/sink 4 mA to 24 mA in increments of 4 mA. Of course other increment levels could be provided by using more than three buffers A, B, C, and/or by providing different current scaling between the various buffer units.

TABLE 1

| $i_o$ | OEC | OEB | OEA |
|---|---|---|---|
| X | 0 | 0 | 1 |
| 2X | 0 | 1 | 0 |
| 3X | 1 | 0 | 0 |
| 4X | 1 | 0 | 1 |
| 5X | 1 | 1 | 0 |
| 6X | 1 | 1 | 1 |

Those skilled in the art of circuit design will recognize that FIGS. 3A and 3B are intended to be examples, and that programmable output buffer 20 may be implemented in other ways as well. Applicant's co-pending U.S. patent application Ser. No. 08/276,091 entitled "OUTPUT BUFFER WITH DIGITALLY CONTROLLED POWER HANDLING CHARACTERISTICS" (filed Jul. 15, 1994 and assigned to the assignee herein) describes several output buffer configurations with which the present invention may be practiced.

For purposes of the present invention, it suffices that output buffer 20 have output characteristics that may be programmed between at least two levels of output source/sink current. A lower level of output source/sink current is used when driving relatively few or light capacitive loads, and a higher level of output source/sink current is used when driving relatively many or large capacitive loads. Of course, intermediate levels of output source/sink current provide greater flexibility and resolution in programming the output buffer characteristics.

The output characteristics are programmed by coupling one or more control signals to control ports of the buffer. In the example of FIGS. 3A and 3B, three control signals OEA, OEB, OEC are coupled from the control signal output port of the present invention to the control signal input ports of output buffer 20. In response to varying combinations of these control signals, output buffer 20 may be dynamically programmed to source/sink different amounts of output current that are appropriate to the load being driven.

Figure 4A:
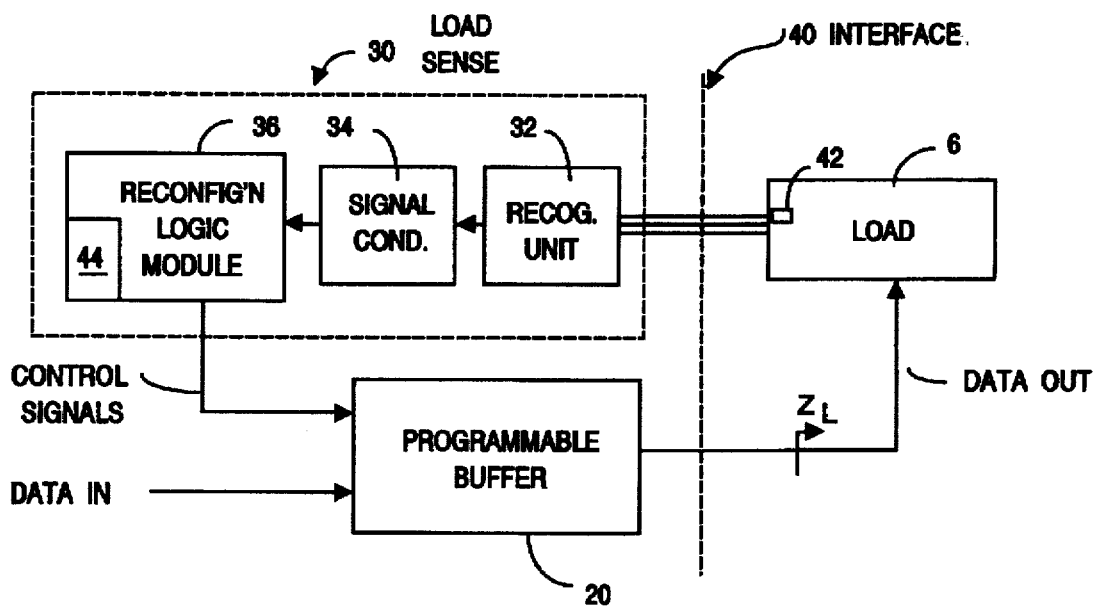
FIG. 4A is a block diagram of a first embodiment of the present invention, wherein a quantized approximation of the load to be driven in made.

FIG. 4A shows a first embodiment of the present invention 30 wherein a programmable buffer 20 receives a DATA input signal that is to be coupled to a load 6 having load impedance $Z_L$. Load 6 may in fact represent a plurality of loads, for example one or more hard disc drive units such that $Z_L$ may assume one of a quantized series of values depending upon the number of disc drive units within load 6 to be driven.

As shown in FIG. 4A, a load sense unit 30 according to the present invention preferably includes a recognition unit 32, a signal conditioner 34 and a reconfiguration logic module 36. The output of the reconfiguration logic module preferably is a set of enabling control signals, e.g., signals OEA, OEB, . . . , similar to what has been described. It is these enabling signals that, when coupled to the control signal input port of the programmable buffer 20, reconfigure buffer 20 to have output source/sink current characteristics appropriate to the $Z_L$ magnitude of the load 6 to be driven.

Communication between load 6 on one hand, and the programmable buffer 20 and the load sense unit 30 on the other hand, typically is through an interface 40. As used herein, interface 40 denotes an industry-wide standard defining how load 6 shall be coupled to a buffer 20. The interface generally defines interconnection pin numbers, signals, signal levels, among other parameters.

Two such standards are the AT Attachment ("AT") interface, and the small computer system interface ("SCSI") interface.

However, frequently the load $Z_L$ is not known a priori or is not one of a quantized set of loads. For example, one or more hard disc units may be coupled to the buffer output through a capacitive buss of uncertain length. Even if the number of hard disc units is known, the unknown buss length will vary $Z_L$ and thus $C_L$. Thus, FIG. 4B discloses an alternative embodiment wherein the present invention approximates $Z_L$ by approximating the shunt load capacitance component $C_L$.

Figure 4B:
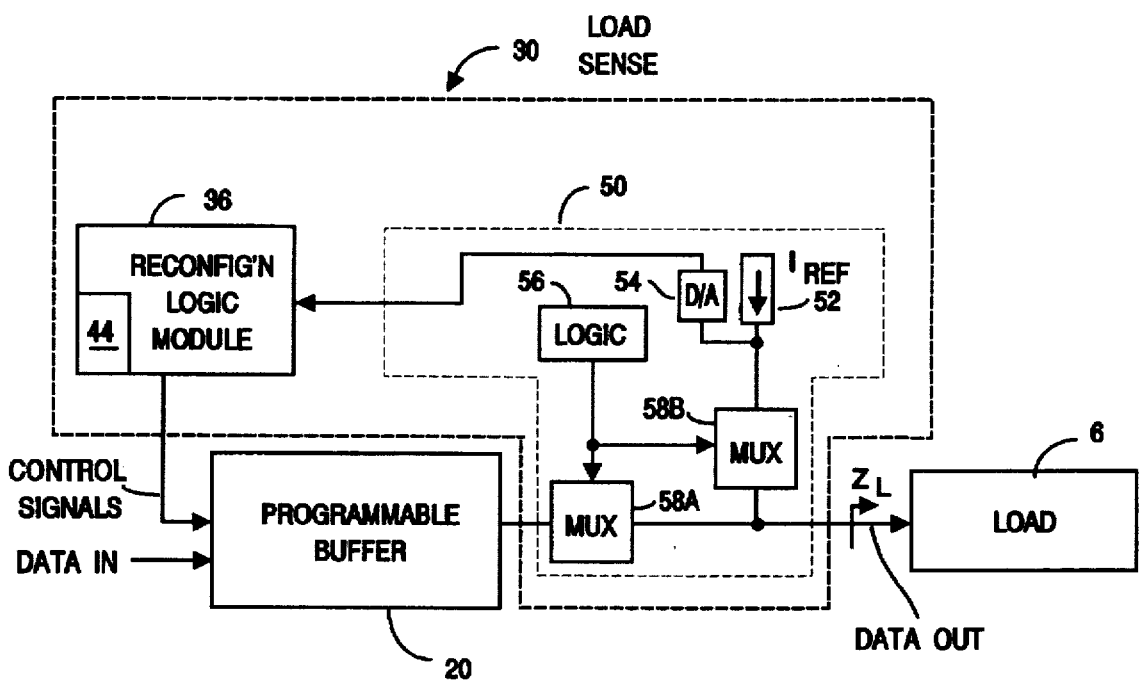
FIG. 4B is a block diagram of a second embodiment of the present invention, wherein a measurement approximating the load to be driven is made.

In the embodiment of FIG. 4B, the present invention 30 includes a load capacitance measuring unit 50, as well as recognition logic 36 that may be identical to what was described above. Measuring unit 50 preferably includes a reference current source $I_{REF}$ 52, an analog-to-digital ("A/D") converter 54, and timing logic 56 that drives two push-pull multiplexer gates 58A, 58B. By push-pull it is meant that gates 58A, 58B are caused by timing logic 56 to operate in complementary fashion such that when gate 58A is open, gate 58B is closed, and vice versa.

Unless load 6 is expected to change during system operation, it can suffice for logic 56 to sense power-on to the system containing load sense 30 and to open gate 58A and close gate 56B for a reference time period only upon power-on. Alternatively, if the application at hand permits interruption of data flow from the output of buffer 20 to the load 6, timing logic 56 may at other times cause the normally closed gate 58A to briefly open, while the normally open gate 58B is briefly closed. During this brief time interval, a dynamic on-the-fly measurement of $C_L$ may be made. Since the voltage v(t) developed across $C_L$ due to $I_{REF}$ will be:

$$v(t) = \frac{I_{REF}}{C_L} \cdot \int dt$$

$C_L$ may be determined by the magnitude of v(t) developed in a given interval of time. For example, if $I_{REF}$ is a 100 μA current source, and if timing logic 56 opens gate 58A and closes gate 58B for a reference time interval of 25 μs, if the voltage measured by A/D comparator 54 is 50 mV, then $C_L \approx 10$ pF. If, however, a buss cable between the output buffer and the load were lengthened, and/or the number of loads were increased, then $C_L$ would increase. If $C_L \approx 20$ pF, then after a 25 μs time interval, the resultant voltage measured by comparator 54 across $C_L$ would be 100 mV, and so on.

The A/D unit 54 would then output a digital representation of the measured voltage across $C_L$ to the reconfiguration logic module 36. Within module 36, a look-up-table or the like (e.g., memory 44) could correlate the measured voltage magnitude (e.g., 50 mV) with the approximate load (e.g., a load having $C_L \approx 20$ pF). The reconfiguration logic module 36 would then output appropriate patterns of control signals to program buffer 20 to adopt output current characteristics appropriate to the approximated load.

Since a rough approximation of $Z_L$ may suffice, D/A converter unit 54 need not be overly sophisticated. If desired, converter unit 54 may comprise several voltage comparators each having a first input coupled to the DATA OUT line, and a second input coupled to a voltage reference that is scaled differently for each comparator. As such, each comparator would change output states only when its particular input threshold voltage was exceeded by the voltage across $C_L$. The outputs of the various comparators could then be logically combined within the reconfiguration logic module 36 to command appropriate control signals to program buffer 20.

Figure 5A:
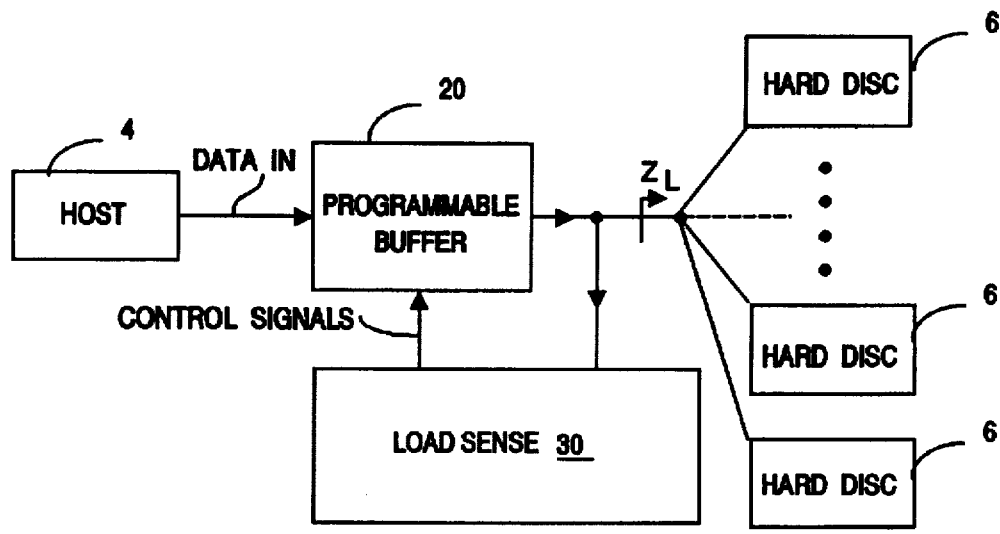
FIG. 5A is a block diagram showing the present invention used to autonomously reconfigure a buffer coupled between a host and multiple hard disc units.
Figure 5B:
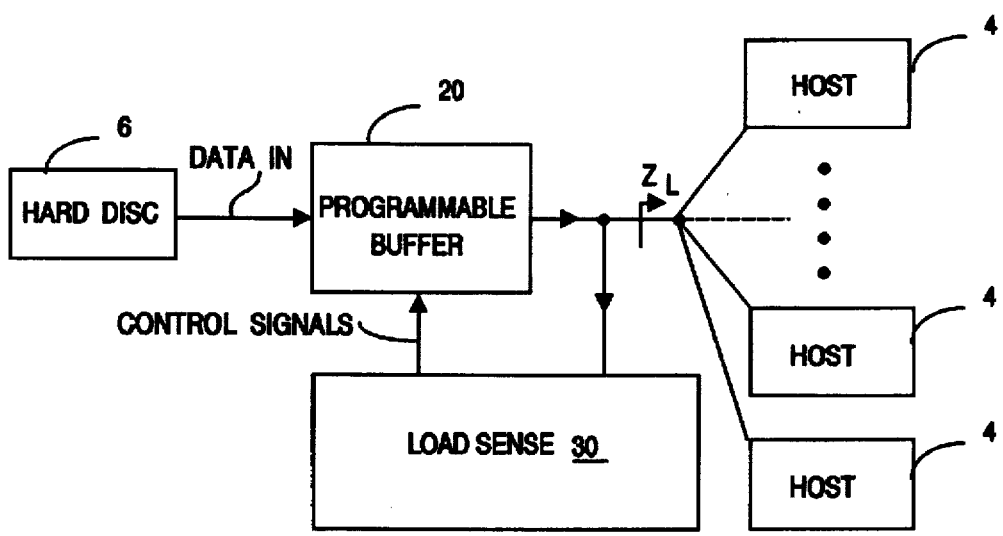
FIG. 5B is a block diagram showing the present invention used to autonomously reconfigure a buffer coupled between a hard disc unit and multiple hosts.
Figure 5C:
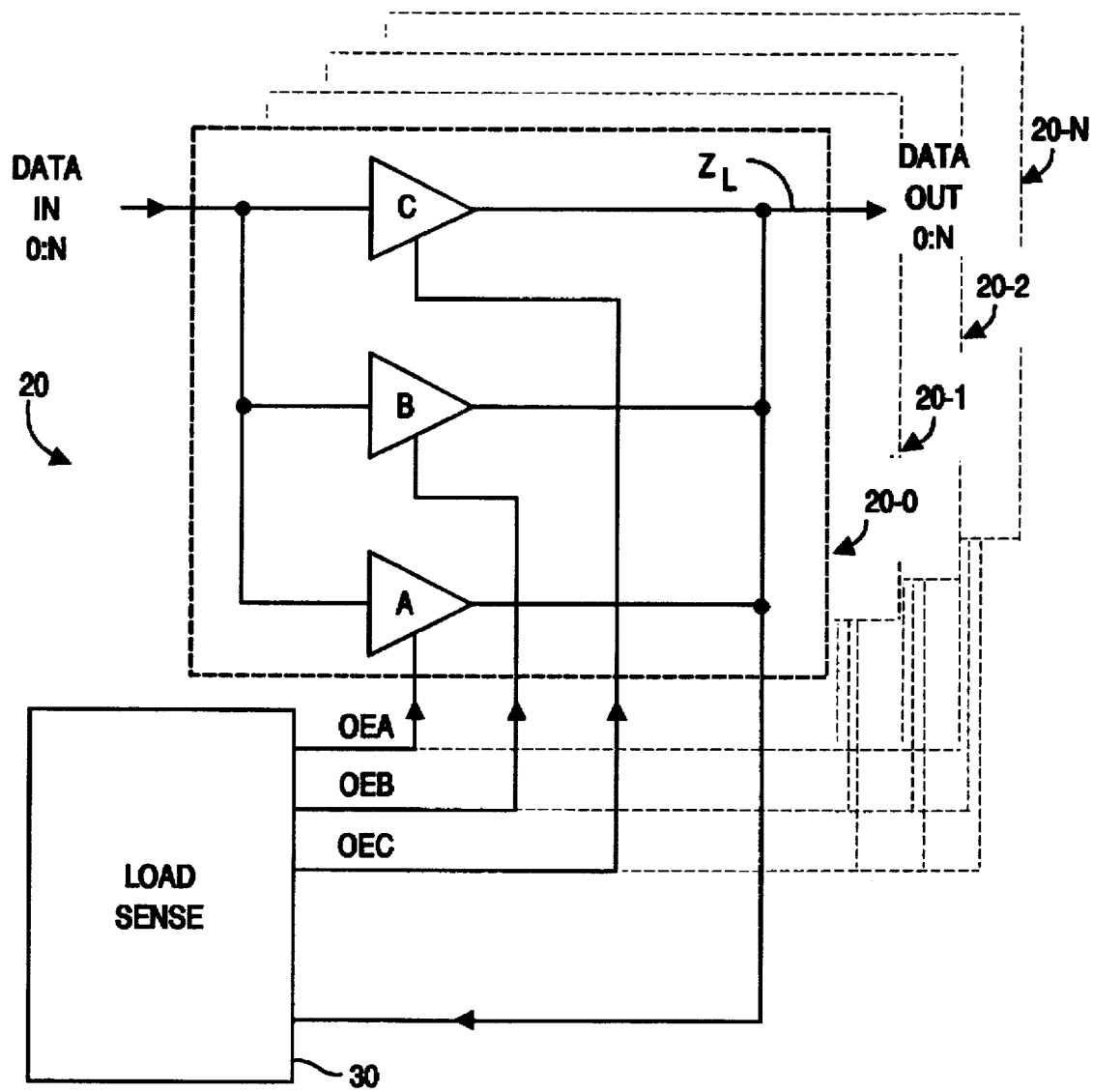
FIG. 5C is a block diagram showing a single load sense unit controlling a programmable multi-bit output buffer, according to the present invention.

FIGS. 5A-5C depict various applications of the present invention. In applications such as shown in FIG. 5A wherein load 6 includes hard disc drive units 6, an AT interface 40 requires that load 6 provide at least one interface bit 42, or other defined protocol (e.g., software), that communicates the number of loads attached. Thus, within the present invention, a recognition unit 32 is coupled to receive the interface bit 42 and to determine from its digital value how many hard disc drive units are to be driven. For example, if interface bit 42 signals two hard disc drive units, then load sense unit 30 outputs control signals reprogramming buffer 20. Buffer 20 would then be caused to source/sink twice the output current than would be used if load 6 contained but a single hard disc drive unit.

On the other hand, many applications use a SCSI interface 40. In these applications, load sense 30 causes output buffer 20 to temporarily act as a master unit that polls the interface to determine the number of attached SCSI-compatible hard disc drive units. Because polling techniques are well known in the art, further details are not here presented.

Whether interface 40 is an AT or an SCSI interface, recognition unit 32 will contain logic that recognizes the interface bit (AT interface), or the polling result (SCSI interface). Where necessary, a signal conditioner unit 34 converts the information recognized by unit 32 into logical signals that are appropriate for the load to be driven. Further signal processing may be done by a reconfiguration logic module 36 whose output will be logic control signals such as OEA, OEB, etc., that program buffer 20.

For example, TABLE 1 described earlier herein provides one correlation between measured load (e.g., anticipated output current $i_o$) and control signals, here OEA, OEB, OEC. Thus, if unit 32 recognized that a light load was to be driven, reconfiguration logic module might output three parallel control signals OEA, OEB, OEC that were, respectively, 001. However, if two "unit" loads were to be driven, for example two disc drive units 6 (see FIG. 5A), then OEA, OEB, OEC might be 010. If a relatively large load were to be driven, OEA, OEB, OEC might be 111, and so on. If desired, the reconfiguration logic module 36 may include a look-up table, e.g., stored in read only memory, or other memory 44 that contains correlations between sensed load and control signals to be output to a programmable buffer 20.

FIG. 5B depicts an application in which a programmable buffer 20 is coupled to a plurality of hosts 4. Load sense unit 30 is coupled to the combined $Z_L$ load impedance presented by hosts 4, and in response to at least an approximation of $Z_L$, unit 30 outputs appropriate control signals to the buffer 20.

FIG. 5C depicts an application in which a single load sense unit 30 reconfigures a programmable multi-bit output buffer 20 to control a multiple number of bits, e.g., a buss. Multi-bit output buffer 20 preferably comprises single-bit output buffers 20-0 (which receives and outputs bit 0), 20-1 (which receives and outputs bit 1), . . . 20-N (which receives and outputs bit N). A single load sense unit 30 may be coupled to the output of a single bit (e.g., to the output line carrying DATA OUT 0:N). A single load sense unit 30 suffices because the various bits 0 . . . N are each carried over identical lengths of identical cable to substantially identical loads, and thus each see substantially an identical $Z_L$.

In response to the sensed load $Z_L$ for any of the bits (e.g., bit 0 in FIG. 5C), load sense unit 30 outputs appropriate enabling signals, e.g., OEA, OEB, OEC, to the unit buffers A, B, C. It is to be understood that the various output buffers 20-x ($0 \leq x \leq N$) may in fact include more or fewer than three unit buffers A, B and C. In this manner, a single load sense unit 30 according to the present invention may be used to load sense and appropriate reconfigure and control the drive characteristics of N output buffers 20-x.

Figure 1A:
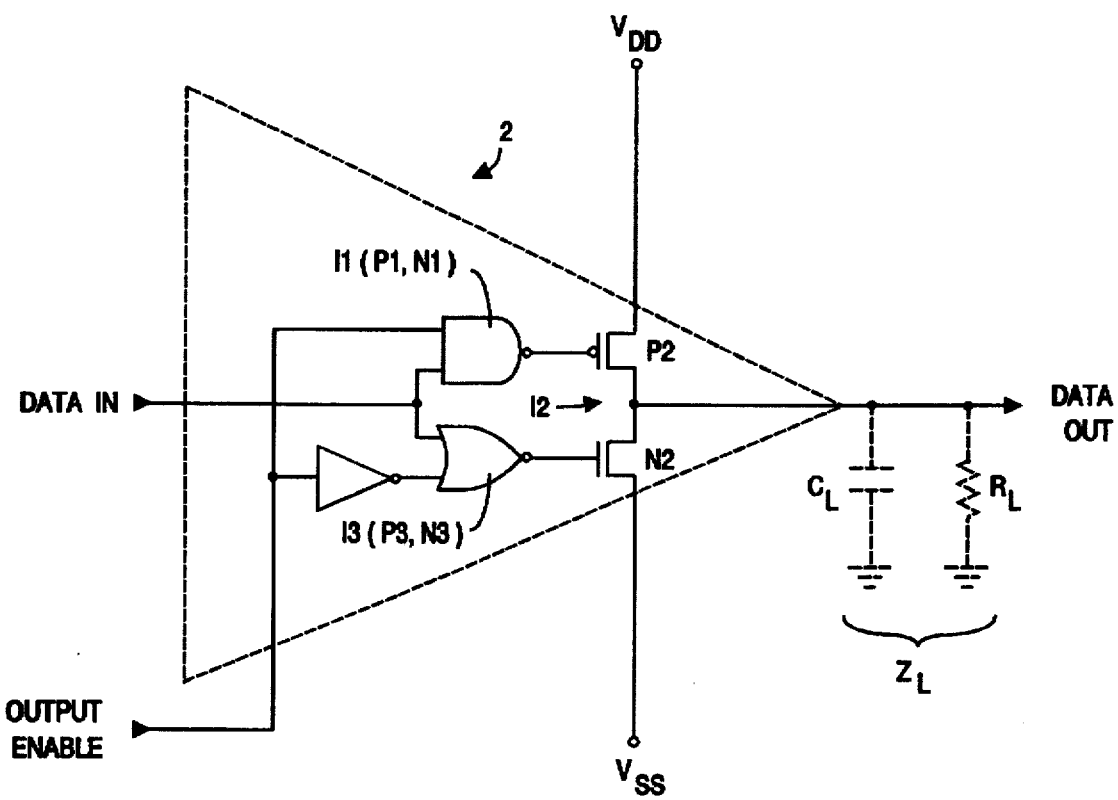
FIG. 1A is a generic depiction of an output buffer, according to the prior art.
Figure 1B:
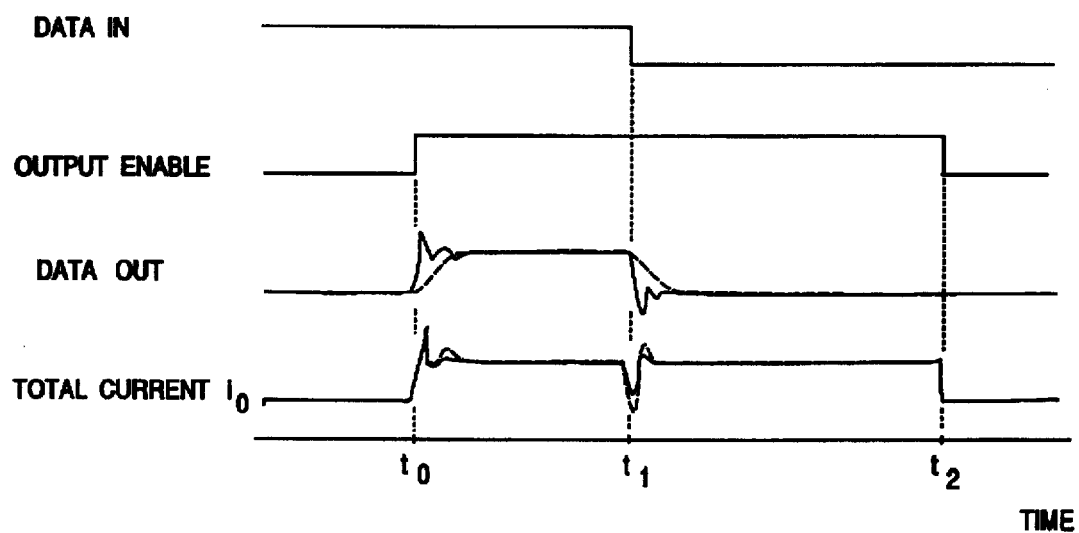
FIG. 1B depicts DATA IN, OUTPUT ENABLE, DATA OUT and total current waveforms associated with the buffer of FIG. 1A.
Figure 2A:
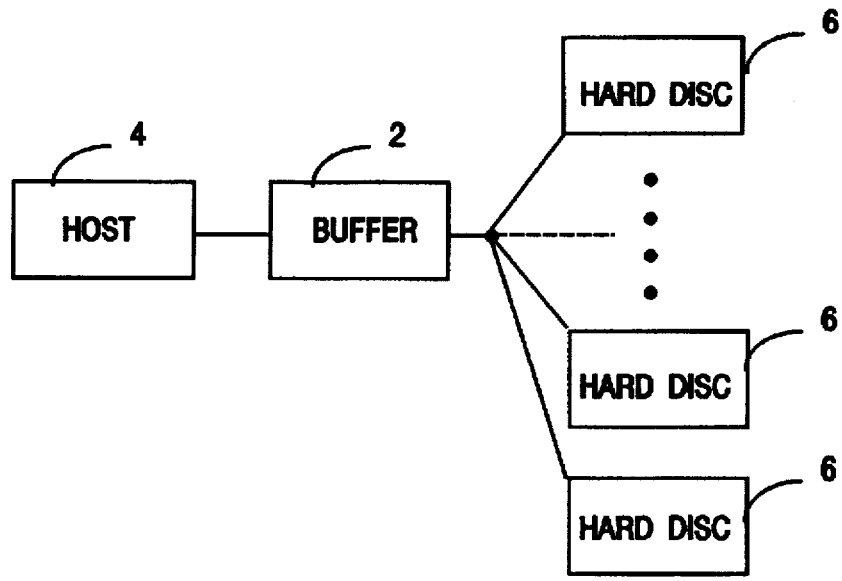
FIG. 2A shows a system wherein a host computer is coupled through a conventional buffer interface to one or more hard disc drive units, according to the prior art.
Figure 2B:
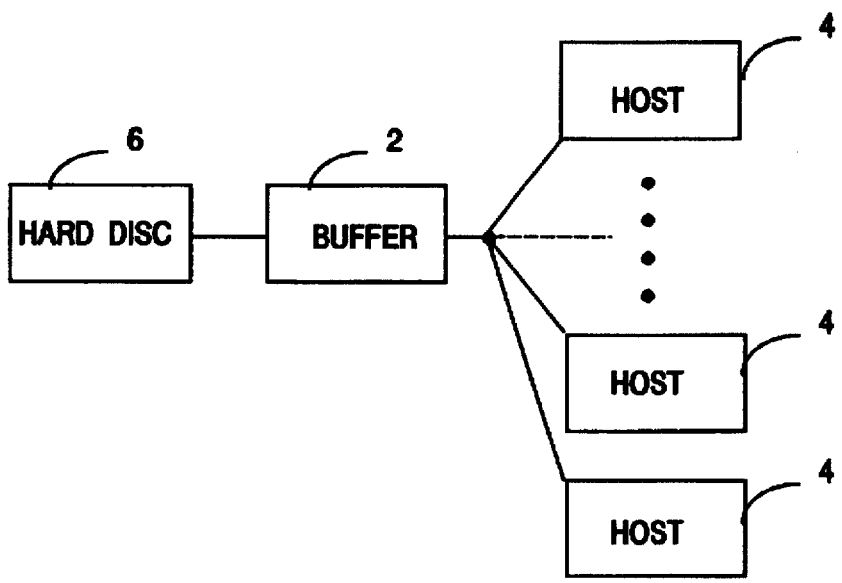
FIG. 2B shows a system wherein a hard disc drive unit is coupled through a conventional buffer interface to one or more host computers, according to the prior art.

In the various embodiments described, it is understood that the programmable buffer 20 may in fact be implemented quite differently than what is suggested by FIGS. 1A, 3A, and 3B. Further, the control signals may likewise be different than what is suggested by these configurations and by TABLE 1.

Those skilled in the art will appreciate that the specific applications and implementations of the present invention that have been set forth are exemplary, and that many other applications and implementations may instead be used. Modifications and variations may be made to the disclosed embodiments without departing from the subject and spirit of the invention as defined by the following claims.

What is claimed is:

1. A system for autonomously selecting source/sink output current characteristics of a programmable buffer coupled to an output load that includes at least one hard disc drive unit, the system comprising:

said programmable buffer having source/sink output current characteristics that are programmably variable in response to at least one control signal;

said programmable buffer having an input port coupled to receive input data, having an output port coupled to said output load, and having a control signal input port coupled to receive at least one said control signal;

an AT Attachment interface governing coupling between said output port of said programmable buffer and said output load;

load sensing and programming means for sensing and approximating a magnitude of said output load and for generating said at least one control signal causing said programmable buffer to adopt output current characteristics as a function of said approximated magnitude of said output load;

said load sensing and programming means having a control signal output port coupling said at least one control signal to said control signal input port of said programmable buffer; and said load sensing and programming means including recognition means for determining an interface bit provided by said AT interface that signals quantity of said hard disc drive units coupled to said output port of said programmable buffer;

wherein said load sensing and programming means generates said at least one control signal in response to a value of said interface bit.

2. The system of claim 1, wherein:

said load sensing and programming means includes means for measuring a capacitive component of said output load;

wherein a measured said capacitive component is used as said magnitude of said output load.

3. The system of claim 2, wherein said means for measuring includes:

a source of reference current, coupled to said output load;

means for measuring a voltage, coupled to said output load, developed as a function of time by said reference current across said capacitive component of said output load;

logic means, coupled to said output load, for controlling connection of said means for measuring to said output load while measuring said voltage, and for controlling disconnection of said means for measuring otherwise;

wherein said voltage provides said magnitude of said output load.

4. The system of claim 1, wherein said load sensing and programming means includes a memory storing data correlating said approximated magnitude of said output load with at least one said control signal to be coupled to said programmable buffer.

5. The system of claim 1, wherein said programmable buffer is coupled between said hard disc drive unit and a plurality of system host units.

6. The system of claim 1, wherein said programmable buffer include at least:

a first enableable unit buffer;

a second enableable unit buffer;

wherein each said enableable unit buffer has an input node, an output node, and an enabling node, each said enableable unit buffer input node being coupled together to form said input port of said programmable buffer, and each said unit enableable buffer output node being coupled together to form said output port of said programmable buffer;

wherein each said enableable unit buffer can source and sink at least a portion of output current sourced and sunk by said output buffer;

wherein said load sensing and programming means provides at least a first enable control signal, coupled to the enabling node on said first enableable unit buffer, and further provides a second enable control signal coupled to the enabling node on said second enableable unit buffer;

wherein said load sensing and programming means, in response to said approximated magnitude of said output load, causes chosen combinations of said first enableable unit buffer and said second enableable unit buffer to be enabled to source/sink output current characteristics of said programmable buffer appropriate to said output load.

7. A system for autonomously selecting source/sink output current characteristics of a programmable buffer coupled to an output load that includes at least one hard disc drive unit, the system comprising:

said programmable buffer having source/sink output current characteristics that are programmably variable in response to at least one control signal;

said programmable buffer having an input port coupled to receive input data, having an output port coupled to said output load, and having a control signal input port coupled to receive at least one said control signal;

load sensing and programming means for sensing and approximating a magnitude of said output load and for generating said at least one control signal causing said programmable buffer to adopt output current characteristics as a function of said approximated magnitude of said output load:

said load sensing and programming means having a control signal output port coupling said at least one control signal to said control signal input port of said programmable buffer, a small computer system interface attachment governing interface coupling between said output port of said programmable buffer and said output load; and said load sensing and programming means including recognition means for causing said programmable buffer to act as a master unit polling said interface coupling and determining quantity of attached said hard disc drive units coupled to said output port of said programmable buffer, wherein said load sensing and programming means generates said at least one control signal in response to said quantity of attached said hard disc drive units.

8. The system of claim 7, wherein:

said load sensing and programming means includes means for measuring a capacitive wherein a measured said capacitive component is used as said magnitude of said output load.

9. The system of claim 8, wherein said means for measuring includes:

a source of reference current, coupled to said output load;

means for measuring a voltage, coupled to said output load, developed as a function of time by said reference current across said capacitive component of said output load;

logic means, coupled to said output load, for controlling connection of said means for measuring to said output load while measuring said voltage, and for controlling disconnection of said means for measuring otherwise;

wherein said voltage provides said magnitude of said output load.

10. The system of claim 7, wherein said load sensing and programming means includes a memory storing data correlating said approximated magnitude of said output load with at least one said control signal to be coupled to said programmable buffer.

11. The system of claim 7, wherein said programmable buffer includes at least:

a first enableable unit buffer;

a second enableable unit buffer;

wherein each said enableable unit buffer has an input node, an output node, and an enabling node, each said enableable unit buffer input node being coupled together to form said input port of said programmable buffer, and each said unit enableable buffer output node being coupled together to form said output port of said programmable buffer;

wherein each said enableable unit buffer can source and sink at least a portion of output current sourced and sunk by said output buffer;

wherein said load sensing and programming means provides at least a first enable control signal, coupled to the enabling node on said first enableable unit buffer, and further provides a second enable control signal coupled to the enabling node on said second enableable unit buffer;

wherein said load sensing and programming means, in response to said approximated magnitude of said output load, causes chosen combinations of said first enableable unit buffer and said second enableable unit buffer to be enabled to source/sink output current characteristics of said programmable buffer appropriate to said output load.

12. A method for autonomously selecting source/sink output current characteristics of a programmable buffer coupled to an output load that includes at least one hard disc drive unit, the method comprising the following steps:

providing said programmable buffer having source/sink output current characteristics that are programmably variable in response to at least one control signal;

said programmable buffer having an input port coupled to receive input data, having an output port coupled to said output load, and having a control signal input port coupled to receive at least one said control signal;

an AT Attachment interface governs coupling between said output port of said programmable buffer and said output load; and providing load sensing and programming means for sensing and approximating a magnitude of said output load and for generating said at least one control signal causing said programmable buffer to adopt output current characteristics as a function of said approximated magnitude of said output load;

said load sensing and programming means having a control signal output port coupling said at least one control signal to said control signal input port of said programmable buffer;

said load sensing and programming means determining an interface bit provided by said interface that signals quantity of said hard disc drive units coupled to said output port of said programmable buffer;

wherein said load sensing and programming means generating said at least one control signal in response to a value of said interface bit.

13. The method of claim 12, wherein:

said load sensing and programming means measures a capacitive component of said output load;

wherein a measured said capacitive component is used as said magnitude of said output load.

14. The method of claim 13, wherein said load sensing and programming means measures said capacitive component by:

coupling a source of reference current to said output load;

measuring a voltage developed as a function of time by said reference current across said capacitive component of said output load; and connecting said load sensing and programming means to said output load while measuring said voltage, and disconnect said load sensing and programing means from said output port otherwise;

wherein said voltage provides said magnitude of said output load.

15. The method of claim 12, wherein said load sensing and programming means stores data correlating said approximated magnitude of said output load with at least one said control signal to be coupled to said programmable buffer.

16. The method of claim 12, wherein said programmable buffer is coupled between said hard disc drive unit and a plurality of system host units.

17. The method of claim 12, wherein said programmable buffer includes at least:

a first enableable unit buffer;

a second enableable unit buffer;

wherein each said enableable unit buffer has an input node, an output node, and an enabling node, each said enableable unit buffer input node being coupled together to form said input port of said programmable buffer, and each said unit enableable buffer output node is coupled together to form said output port of said programmable buffer;

wherein each said enableable unit buffer can source and sink at least a portion of output current sourced and sunk by said output buffer; and wherein said load sensing and programming means provides at least a first enable control signal, coupled to the enabling node on said first enableable unit buffer, and further provides a second enable control signal coupled to the enabling node on said second enableable unit buffer;

wherein said load sensing and programming means, in response to an approximated said magnitude of said output load causes chosen combinations of said first enableable unit buffer and said second enableable unit buffer to be enabled to source/sink output current characteristics of said programmable buffer.

18. A method for autonomously selecting source/sink output current characteristics of a programmable buffer coupled to an output load that includes at least one hard disc drive unit, the method comprising the following steps:

providing said programmable buffer having source/sink output current characteristics that are programmably variable in response to at least one control signal:

said programmable buffer having an input port coupled to receive input data, having an output port coupled to said output load, and having a control signal input port coupled to receive at least one said control signal; providing load sensing and programming means for sensing and approximating a magnitude of said output load and for generating said at least one control signal causing said programmable buffer to adopt output current characteristics as a function of said approximated magnitude of said output load;

said load sensing and programming means having a sense input coupled to said output port of said programmable buffer, and having a control signal output port coupling said at least one control signal to said control signal input port of said programmable buffer;

a small computer system interface attachment governs interface coupling between said output port of said programmable buffer and said output load; and said load sensing and programming means causes said programmable buffer to act as a master unit polling said interface coupling and determining quantity of attached said hard disc drive units coupled to said output port of said programmable buffer;

wherein said load sensing and programming means generates said at least one control signal in response to said quantity of attached said hard disc drive units.

19. The method of claim 18, wherein:

said load sensing and programming means measures a capacitive component of said output load;

wherein a measured said capacitive component is used as said magnitude of said output load.

20. The method of claim 19, wherein said load sensing and programming means measures said capacitive component by:

coupling a source of reference current to said output load;

measuring a voltage developed as a function of time by said reference current across said capacitive component of said output load; and connecting said load sensing and programming means to said output load while measuring said voltage, and disconnect said load sensing and programming means from said output port otherwise;

wherein said voltage provides said magnitude of said output load.

21. The method of claim 18, wherein said load sensing and programming means stores data correlating said approximated magnitude of said output load with at least one said control signal to be coupled to said programmable buffer.

22. The method of claim 21, wherein said programmable buffer is coupled between said hard disc drive unit and a plurality of system host units.

23. The method of claim 18, wherein said programmable buffer includes at least:

a first enableable unit buffer;

a second enableable unit buffer;

wherein each said enableable unit buffer has an input node, and output node and enabling node, each said enableable unit buffer input node being coupled together to form said input port of said programmable buffer, and each said unit enableable buffer output node is coupled together to form said output port of said programmable buffer;

wherein each said enableable unit buffer can source and sink at least a portion of output current sourced and sunk by said output buffer; and wherein said load sensing and programming means provides at least a first enable control signal, coupled to the enabling node on said first enableable unit buffer, and further provides a second enable control signal coupled to the enabling node on said second enableable unit buffer;

wherein said load sensing and programming means, in response to a said approximated magnitude of said output load causes chosen combinations of said first enableable unit buffer and said second enableable unit buffer to be enabled to source/sink output current characteristics of said programmable buffer.

24. The method of claim 20, wherein said programmable buffer includes at least:

a first enableable unit buffer;

a second enableable unit buffer;

wherein each said enableable unit buffer has an input node, and output node and enabling node, each said enableable unit buffer input node being coupled together to form said input port of said programmable buffer, and each said unit enableable buffer output node is coupled together to form said output port of said programmable buffer;

wherein each said enableable unit buffer can source and sink at least a portion of output current sourced and sunk by said output buffer; and wherein said load sensing and programming means provides at least a first enable control signal, coupled to the enabling node on said first enableable unit buffer, and further provides a second enable control signal coupled to the enabling node on said second enableable unit buffer;

wherein said load sensing and programming means, in response to said approximated magnitude of said output load causes chosen combinations of said first enableable unit buffer and said second enableable unit buffer to be enabled to source/sink output current characteristics of said programmable buffer.

\* \* \* \* \*